US012764980B2

(12) United States Patent
Kim et al.

(10) Patent No.: US 12,764,980 B2
(45) Date of Patent: Oct. 13, 2026

(54) SEMICONDUCTOR DEVICE HAVING A LOW RESISTIVITY TRENCH CAPACITOR

(71) Applicant: SK keyfoundry Inc., Cheongju-si (KR)

(72) Inventors: Youngryeol Kim, Pyeongtaek-si (KR); Hyunchul Kim, Chilgok-gun (KR)

(73) Assignee: SK keyfoundry Inc., Cheongju-si (KR)

( * ) Notice: Subject to any disclaimer, the term of this patent is extended or adjusted under 35 U.S.C. 154(b) by 390 days.

(21) Appl. No.: 18/522,740

(22) Filed: Nov. 29, 2023

(65) Prior Publication Data

US 2024/0429271 A1 Dec. 26, 2024

(30) Foreign Application Priority Data

Jun. 26, 2023 (KR) ........................ 10-2023-0082070

(51) Int. Cl.
*H10D 1/68* (2025.01)

(52) U.S. Cl.
CPC .................................. *H10D 1/716* (2025.01)

(58) Field of Classification Search
CPC ...... H10D 1/716; H10D 1/665; H10D 84/212; H10W 44/601; H10W 44/20
See application file for complete search history.

(56) References Cited

U.S. PATENT DOCUMENTS

| | | | | |
|---|---|---|---|---|
| 4,953,125 A * | 8/1990 | Okumura | H10B 12/37 257/E27.092 |
| 5,183,774 A * | 2/1993 | Satoh | H10D 1/047 438/242 |
| 10,784,267 B1 * | 9/2020 | Chao | H10B 10/12 |
| 2004/0228067 A1 * | 11/2004 | Gutsche | H10D 1/047 257/E21.396 |
| 2007/0023805 A1 * | 2/2007 | Wells | H10B 12/482 257/295 |
| 2013/0221483 A1 * | 8/2013 | Popp | H10D 1/716 257/532 |
| 2022/0406885 A1 | 12/2022 | Hu et al. | |
| 2023/0032620 A1 | 2/2023 | Tseng et al. | |
| 2023/0060558 A1 | 3/2023 | Chang | |
| 2023/0066352 A1 | 3/2023 | Liu et al. | |
| 2023/0068481 A1 | 3/2023 | Kuo | |
| 2024/0429221 A1 * | 12/2024 | Waidhas | H10W 70/685 |

* cited by examiner

*Primary Examiner* — Galina G Yushina
(74) *Attorney, Agent, or Firm* — NSIP Law

(57) ABSTRACT

A trench capacitor includes a trench disposed in a substrate; an inner electrode disposed in a central portion of the trench and having a top surface and a bottom surface; an outer electrode disposed symmetrically with respect to the inner electrode, the outer electrode having a depth shallower than a depth of the inner electrode with respect to a top surface of the substrate; a thick bottom insulating layer disposed below the inner electrode and the outer electrode; and a capacitor dielectric layer surrounding the outer electrode. The outer electrode protrudes above the top surface of the substrate and has a top surface that is higher than the top surface of the inner electrode.

13 Claims, 8 Drawing Sheets

30

SEMICONDUCTOR DEVICE HAVING A LOW RESISTIVITY TRENCH CAPACITOR

CROSS REFERENCE TO RELATED APPLICATION

This application claims the benefit under 35 U.S.C. 119(a) of Korea Patent Application No. 10-2023-0082070 filed on Jun. 26, 2023 in the Korean Intellectual Property Office, the entire disclosure of which is incorporated herein by reference for all purposes.

BACKGROUND

1. Field

The following description relates to a semiconductor device having a low resistivity trench capacitor.

2. Description of the Related Art

Trench capacitor devices are suitable for high-frequency decoupling applications. Typically, trench capacitors comprise a lower electrode, a dielectric layer, and an upper electrode. The lower and upper electrodes are made of the same material, such as doped poly-Si, which has a higher resistivity than metallic layers like Al or Cu. Typical trench capacitors often experience high series resistance, leading to poor frequency response. To address this issue, various trench capacitor structures have been developed to decrease the resistivity of either the lower or upper electrode.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a trench capacitor includes a trench disposed in a substrate; an inner electrode disposed in a central portion of the trench and having a top surface and a bottom surface; an outer electrode disposed symmetrically with respect to the inner electrode, the outer electrode having a depth shallower than a depth of the inner electrode with respect to a top surface of the substrate; a thick bottom insulating layer disposed below the inner electrode and the outer electrode; and a capacitor dielectric layer surrounding the outer electrode, wherein the outer electrode protrudes above the top surface of the substrate and has a top surface that is higher than the top surface of the inner electrode.

The outer electrode disposed in the trench may be physically connected to another outer electrode disposed in an adjacent trench.

A connection portion may be disposed between the outer electrode and the another outer electrode and may be positioned above the top surface of the substrate. The outer electrode may include a metallic layer.

The capacitor dielectric may have a thickness thinner than a thickness of the thick bottom insulation layer, and the outer electrode may have a ring shape surrounding the inner electrode in a plan view.

The capacitor dielectric layer may be disposed at least along trench sidewalls of an upper portion of the trench, interfaced with the thick bottom insulation layer, and extended on the top surface of the inner electrode.

The trench capacitor may include a doped region disposed in the substrate; a first contact plug connected to the inner electrode; a second contact plug connected to the outer electrode; and a third contact plug connected to the doped region and electrically connected to the first contact plug by a first metal interconnection.

In another general aspect, a trench capacitor includes a first trench and a second trench disposed in a substrate; a first inner electrode formed in a central portion of the first trench; a first capacitor dielectric layer disposed on the first inner electrode; a second inner electrode formed in a central portion of the second trench; a first outer electrode and a second outer electrode disposed symmetrically with respect to the first inner electrode; and a third outer electrode and a fourth outer electrode disposed symmetrically with respect to the second inner electrode. Each of the first to fourth outer electrodes may have a shallower depth compared to each of the first and second inner electrodes in relation to a top surface of the substrate, and the second outer electrode disposed in the first trench may be physically connected to the third outer electrode disposed in the second trench.

The first and second outer electrodes may protrude above the top surface of the substrate, and each may have a top surface located higher than a top surface of the first inner electrode.

The second and third outer electrodes may be connected to each other through a connection portion disposed on the top surface of the substrate.

Each of the first to fourth outer electrodes may include a material different from a material of the first or second inner electrode.

The trench capacitor may further include a thick bottom insulating layer formed below the first inner electrode and the first and second outer electrodes; a doped region disposed in the substrate; a first contact plug connected to the first inner electrode; a second contact plug connected to the first and second outer electrodes; and a third contact plug connected to the doped region. The third contact plug may be electrically connected to the first contact plug through a first metal interconnection.

The trench capacitor may further include a middle electrode disposed in a central portion of each of the first to fourth outer electrodes; a middle capacitor dielectric layer disposed under the middle electrode; and a fourth contact plug connected to the middle electrode and electrically connected to the first contact plug through the first metal interconnection.

Effects which may be obtained by the present disclosure are not limited to the aforementioned effects, and other technical effects not described above may be evidently understood by a person having ordinary skill in the art to which the present disclosure pertains from the following description.

Figure 1:
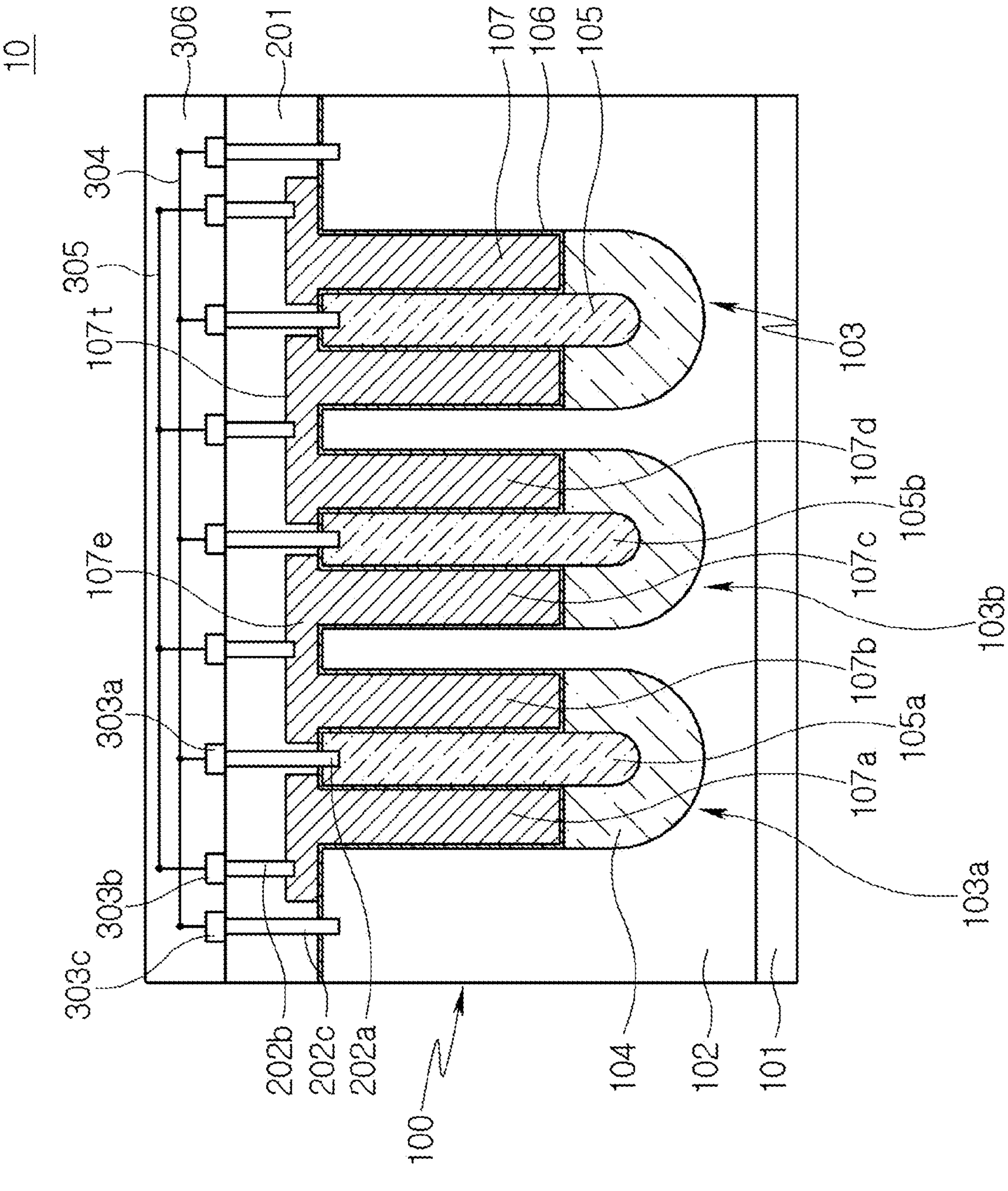
FIG. 1 illustrates a cross-sectional view of a semiconductor device having a low resistivity trench capacitor according to an example of the present disclosure.

Other features and aspects will be apparent from the following detailed description, the drawings, and the claims.

DETAILED DESCRIPTION

The merits and characteristics of the present disclosure and a method for achieving the merits and characteristics will become more apparent from the examples described in detail in conjunction with the accompanying drawings. However, the present disclosure is not limited to the disclosed examples, but may be implemented in various different ways. These examples are provided so that this disclosure will be thorough and complete, and will fully convey the scope of the present disclosure to those skilled in the art. The present disclosure will be defined only by the scope of the appended claims. Like reference numerals generally denote like elements throughout the specification.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

The terms used in the present specification are merely used to describe specific examples and are not intended to limit the present disclosure. A singular expression includes a plural expression unless a description to the contrary is specifically pointed out in context. The terms "comprises" and/or "comprising," when used herein, specify the presence of stated elements, steps, operations, and/or components, but do not preclude the presence or addition of one or more other elements, steps, operations, and/or components.

Although the terms including an ordinal number such as first, second, etc. may be used for describing various elements, the structural elements are not restricted by the terms. The terms are only used to distinguish one element from another element.

Therefore, a first component to be mentioned below may be a second component in a technical concept of the present disclosure. Unless otherwise defined, all terms including technical and scientific terms used herein have the same meaning as commonly understood by one of ordinary skill in the art to which this invention belongs. It will be further understood that terms, such as those defined in commonly used dictionaries, will not be interpreted in an idealized or overly formal sense unless expressly so defined herein.

A term "part" or "module" used in the examples may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some examples of the present invention may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the storage medium may reside in an application specific integrated circuit (ASIC). The ASIC may be resident within a user's terminal.

Hereinafter, a detailed description will be given as to the examples of the present invention with reference to the accompanying drawings in order for those skilled in the art to embody the present invention with ease. But the present invention is susceptible to variations and modifications and not limited to the examples described herein.

FIG. 1 illustrates a cross-sectional view of a semiconductor device having a low resistivity trench capacitor according to an example of the present disclosure.

Referring to FIG. 1, according to an example, a semiconductor device having a low resistivity trench capacitor structure 10 includes a substrate 100 comprising a P-type substrate 101. The semiconductor device having a low resistivity trench capacitor structure 10 further comprises a doped region 102 and a trench 103 formed on the P-type substrate 101. The trench 103 may have one or more trenches. Each trench 103 may contact the doped region 102. The semiconductor device having a low resistivity trench capacitor structure 10 further comprises a thick bottom insulating layer 104, an inner electrode 105 formed on the thick bottom insulating layer 104, a capacitor dielectric layer 106, and an outer electrode 107 formed in each trench 103.

The semiconductor device having a low resistivity trench capacitor structure 10 further comprises a first inter-layer insulating layer 201, first to third contact plugs 202*a* to 202*c*, first to third metal wirings 303*a* to 303*c*, a first metal interconnection 304, second metal interconnection 305 and a second inter-layer insulating layer 306 formed on the substrate 100.

Referring to FIG. 1, a semiconductor substrate 100 may comprise a P-type substrate 101 and a highly N-type doped region 102 formed on the P-type substrate. The P-type substrate 101 may be replaced with an N-type conductivity type. The N-type conductivity type of the highly doped region 102 may be also replaced with a P-type conductivity type. The N-type conductivity type of the highly doped region 102 may be replaced with an N-type or P-type epitaxial layer. The highly N-type doped region 102 may be implemented for a lower electrode or a bottom electrode in the semiconductor device having a low resistivity trench capacitor structure 10. The highly doped region 102 may be formed by implanting dopants into the semiconductor substrate 100.

Referring to FIG. 1, the trench 103 may be formed by a reactive ion etching (RIE) process. The RIE is a type of plasma etch technology implemented for a semiconductor device with a low resistivity trench capacitor structure 10. The depth and width of the trench 103 may vary depending on conditions of the targeted semiconductor device with a low resistivity trench capacitor structure 10.

Referring to FIG. 1, the thick bottom insulating layer 104 may be formed on a lower portion inside the trench 103. The thick bottom insulating layer 104 may be formed by depositing an oxide layer within the trench 103, and then performing an etch-back or recess process on the oxide layer. The thick bottom insulating layer 104 may surround a lower portion of the inner electrode 105.

Referring to FIG. 1, the inner electrode 105 may be formed on the thick bottom insulating layer 104 and disposed in a central portion of the trench 103. A lower portion of the inner electrode 105 may be surrounded by the thick bottom insulating layer 104.

The inner electrode 105 may comprise a doped or undoped poly-Si layer, a metal layer or a metal nitride layer. For example, the metal layer or metal nitride layer may be titanium nitride (TIN), a tungsten nitride (WN), a tantalum nitride (TaN), titanium (Ti) layer, a tungsten (W), a tantalum (Ta), aluminum (Al), copper (Cu), or a combination thereof. For example, low-resistivity titanium nitride (TiN) thin films for the inner electrode 105 may be fabricated by atomic layer deposition (ALD) using TiCl4 and metal organic precursors.

The aforementioned metal layer or metal nitride material for the inner electrode 105 may have a lower resistance than the typical doped poly-Si material. The metallic layer of the inner electrode 105 may provide a lower resistivity of the trench capacitor structure 10 of the present disclosure than a typical trench capacitor structure. The low resistivity of the trench capacitor structure 10 may be helpful for high speed applications.

The inner electrode 105 may be referred to as a first electrode. The inner electrode 105 may be surrounded by two adjacent outer electrodes 107. The inner electrode 105 may have a deeper depth than that of the outer electrode 107 to increase the capacitance of the trench capacitor. The inner electrode 105 may also have a width greater than that of the outer electrode 107.

Referring to FIG. 1, the capacitor dielectric layer 106 may be disposed on the thick bottom insulating layer 104 and the inner electrode 105. Further, the capacitor dielectric layer 106 may be disposed on a sidewall of the trench 103 and enclose a bottom surface and sidewalls of the outer electrode 107 and extend on a top surface of the inner electrode 105. Thus, the capacitor dielectric layer 106 may be also located between the inner electrode 105 and the outer electrode 107. The capacitor dielectric layer 106 may be disposed between the outer electrode 107 and the thick bottom insulating layer 104. The capacitor dielectric layer 106 may be referred to as a first dielectric layer.

The capacitor dielectric layer 106 may comprise the same material as the thick bottom insulating layer 104 and be deposited by a chemical vapor deposition (CVD) process to form a conformal shape. The capacitor dielectric layer 106 may comprise silicon oxide, silicon nitride, silicon oxynitride, or high-k materials. Examples of high-k materials may include, but are not limited to, Al2O3, HfO2, Ta2O5, and the like.

The outer electrode 107 may include a metal layer or a metal nitride layer to lower a resistance of the outer electrode 107. For example, the outer electrode 107 may include titanium nitride (TIN), a tungsten nitride (WN), a tantalum nitride (TaN), titanium (Ti) layer, a tungsten (W), a tantalum (Ta), aluminum (Al), copper (Cu), or a combination thereof. The metal nitride material provided for the outer electrode 107 may have lower resistance than the doped poly-Si material provided for the conventional top or bottom electrode. The metallic layer of the outer and inner electrodes 105 and 107 may provide a lower resistivity of the trench capacitor structure 10.

Referring to FIG. 1, the outer electrode 107 may be formed on the capacitor dielectric layer 106 formed in the trench 103. The outer electrode 107 may comprise two adjacent outer electrodes 107*a* and 107*b* in a first trench 103*a*, surround the inner electrode 105*a*, and be symmetrically disposed with respect to the inner electrode 105*a*. The outer electrode 107 may have a depth shallower than a depth of the inner electrode 105 with respect to a top surface of the semiconductor substrate 100. The outer electrode 107 may be referred to as a second electrode.

Further, the outer electrode 107 may comprise third and fourth outer electrodes 107*c* and 107*d* respectively formed in a second trench 103*b*. Here, the second trench 103*b* may be adjacent to the first trench 103*a*. Thus, the second outer electrode 107*b* in the first trench 103*a* is positioned parallel to the third outer electrode 107*c* in the second trench 103*b*. The second outer electrode 107*b* formed in the first trench 103*a* may be physically connected to the third outer electrode 107*c* formed in the second trench 103*b* through a connection portion 107*e* of the outer electrode 107. The connection portion 107*e* of the outer electrode 107 may be disposed above the inner electrode 105.

All of the third and fourth outer electrodes 107*c* and 107*d* and the connection portion 107*e* may be metallic layers, so that the total resistivity of the trench capacitor structure 10 may be much lower than a resistivity of the conventional trench capacitor structure using a doped poly-Si electrode.

Further, a top surface 107*t* of the outer electrode 107 may protrude above a top surface of the semiconductor substrate 100. Thus, the outer electrode 107 may have the top surface 107*t* having a height higher than a height of the top surface of the inner electrode 105. Increasing a vertical length of the outer electrode 107 may be helpful to reduce the total resistivity of the trench capacitor structure 10.

Referring to FIG. 1, the first inter-layer insulating layer 201 may be formed over the trench 103 as well as the inner electrode 105 and the outer electrode 107. The first inter-layer insulating layer 201 may comprise a material such as silicon oxide (SiO2) film, undoped silicate glass (USG), tetraethyl orthosilicate (TEOS), boro-phospho silicate glass (BPSG), or phosphosilicate glass (PSG).

Referring to FIG. 1, the first, second and third contact plugs 202*a*, 202*b* and 202*c* may be formed in the first inter-layer insulating layer 201. The first, second and third contact plugs 202*a*, 202*b* and 202*c* may be connected to the inner electrode 105, the outer electrode 107 and the highly doped region 102, respectively.

Referring to FIG. 1, the first, second and third metal wirings 303*a*, 303*b* and 303*c* may be formed on the first inter-layer insulating layer 201 and connected to the first to third contact plugs 202*a* to 202*c*, respectively. The first, second and third metal wirings 303*a*, 303*b* and 303*c* may be finally connected to the inner electrode 105, the outer electrode 107 and the highly doped region 102, respectively.

Referring to FIG. 1, a first metal interconnection 304, second metal interconnection 305 and a second inter-layer insulating layer 306 may be formed on the first inter-layer insulating layer 201 and the first to third metal wirings 303*a* to 303*c*.

The first and third metal wirings 303*a* and 303*c* may be electrically connected to each other through the first metal interconnection 304 to form lower electrodes in the semiconductor device having a low resistivity trench capacitor structure 10.

In addition, the second metal wiring 303*b* and adjacent second metal wirings 303*b* may be electrically connected to each other through the second metal interconnection 305 to form upper electrodes in the semiconductor device having a low resistivity trench capacitor structure 10.

Figure 2:
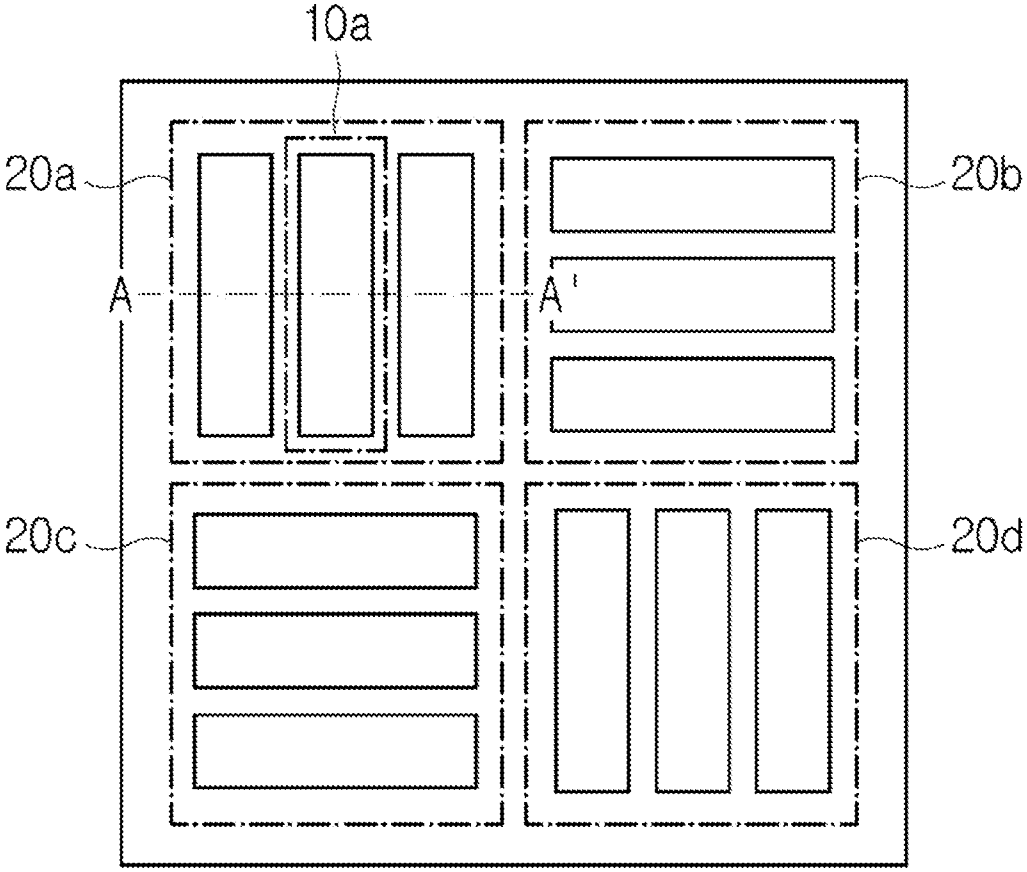
FIG. 2 illustrates an array of trench capacitor according to an example of the present disclosure.

FIG. 2 illustrates an array of trench capacitor according to an example of the present disclosure.

Referring to FIG. 2, the array of trench capacitors may comprise multiple groups, for example, a first group 20*a*, a second group 20*b*, a third group 20*c*, and a fourth group 20*d*. For example, each group may comprise at least three trench capacitors 10*a*. The first and fourth groups 20*a* and 20*d* are arranged diagonally to each other, and they may have the same long axis direction. In the same manner, the second and third groups 20*b* and 20*c* are arranged diagonally to each other, and they may have the same long axis direction. The major axis (long axis) directions of the first and fourth groups 20*a* and 20*d* are perpendicular to those of the second and third groups 20*b* and 20*c*. The array trench capacitor having these orientations may be helpful in increasing the pattern density and total capacitance of the semiconductor device having a low resistivity trench capacitor structure 10.

Figure 3:
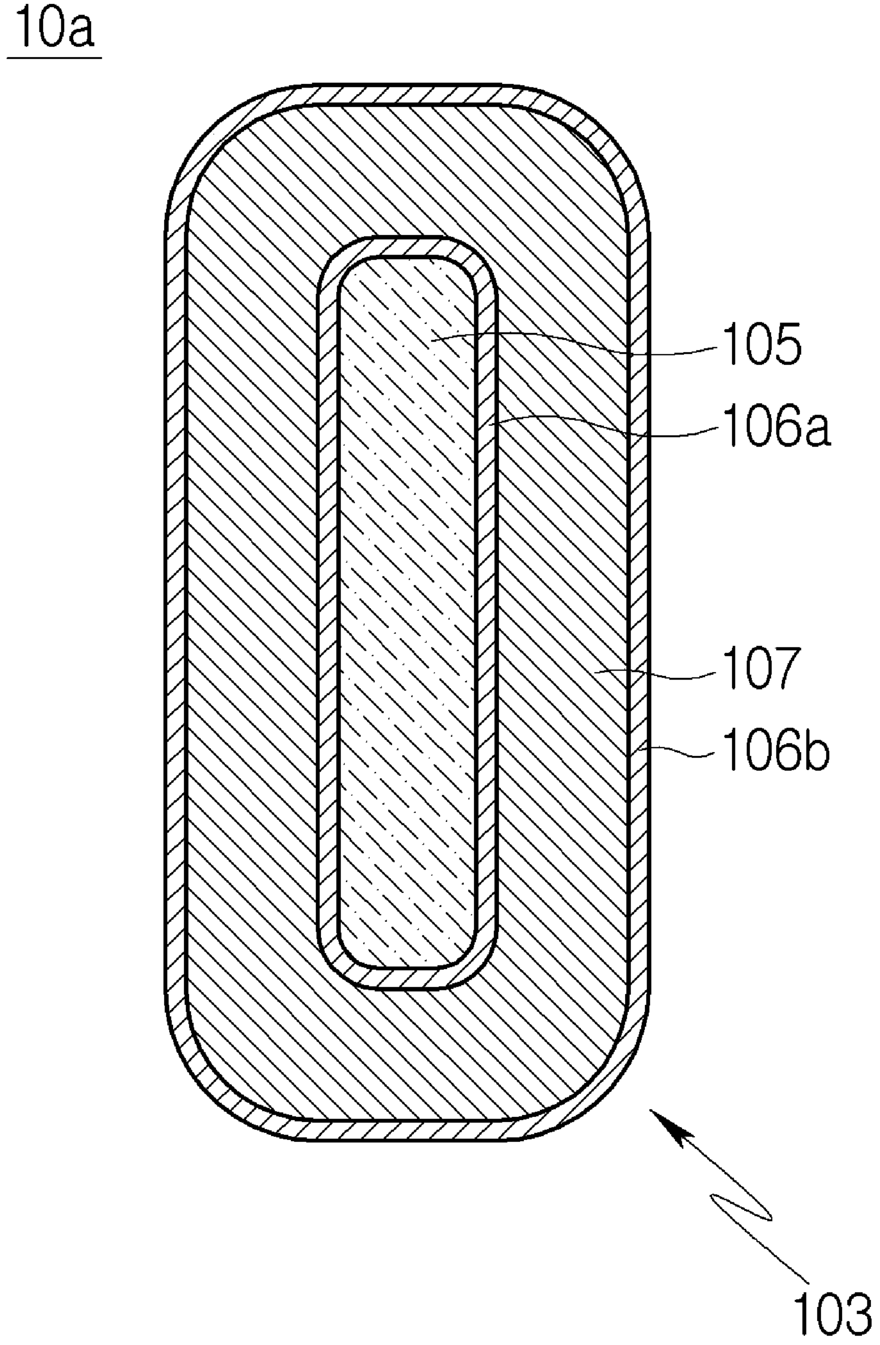
FIG. 3 illustrates a top view of one trench capacitor in FIG. 2.

FIG. 3 illustrates a top view of one trench capacitor shown in FIG. 2.

Referring to FIG. 3, in a top view, the inner electrode 105 may be disposed in a central portion of the trench 103. The outer electrode 107 may surround the inner electrode 105. Each corner of the trench capacitor 10*a* may be rounded to reduce a stress that tend to occur in the trench 103.

Further, the capacitor dielectric layer 106 may comprise an inner capacitor dielectric layer 106*a* and an outer capacitor dielectric layer 106*b*. The inner capacitor dielectric layer 106*a* may be disposed between the inner electrode 105 and the outer electrode 107. Thus, the outer electrode 107 may surround the inner capacitor dielectric layer 106*a* and the inner electrode 105.

The outer capacitor dielectric layer 106*b* may enclose the outer electrode 107, the inner capacitor dielectric layer 106*a*, and the inner electrode 105. The outermost capacitor dielectric layer 106*b* may be disposed on the sidewalls of the trench 103.

Further, in a top view, each top corner of the inner electrode 105 and the outer electrode 107 may be rounded. A tensile or compressive stress may be generally concentrated at a corner of the deep trench. The rounded corner may be helpful in relieving the tensile or compressive stress at the corner.

Figure 4:
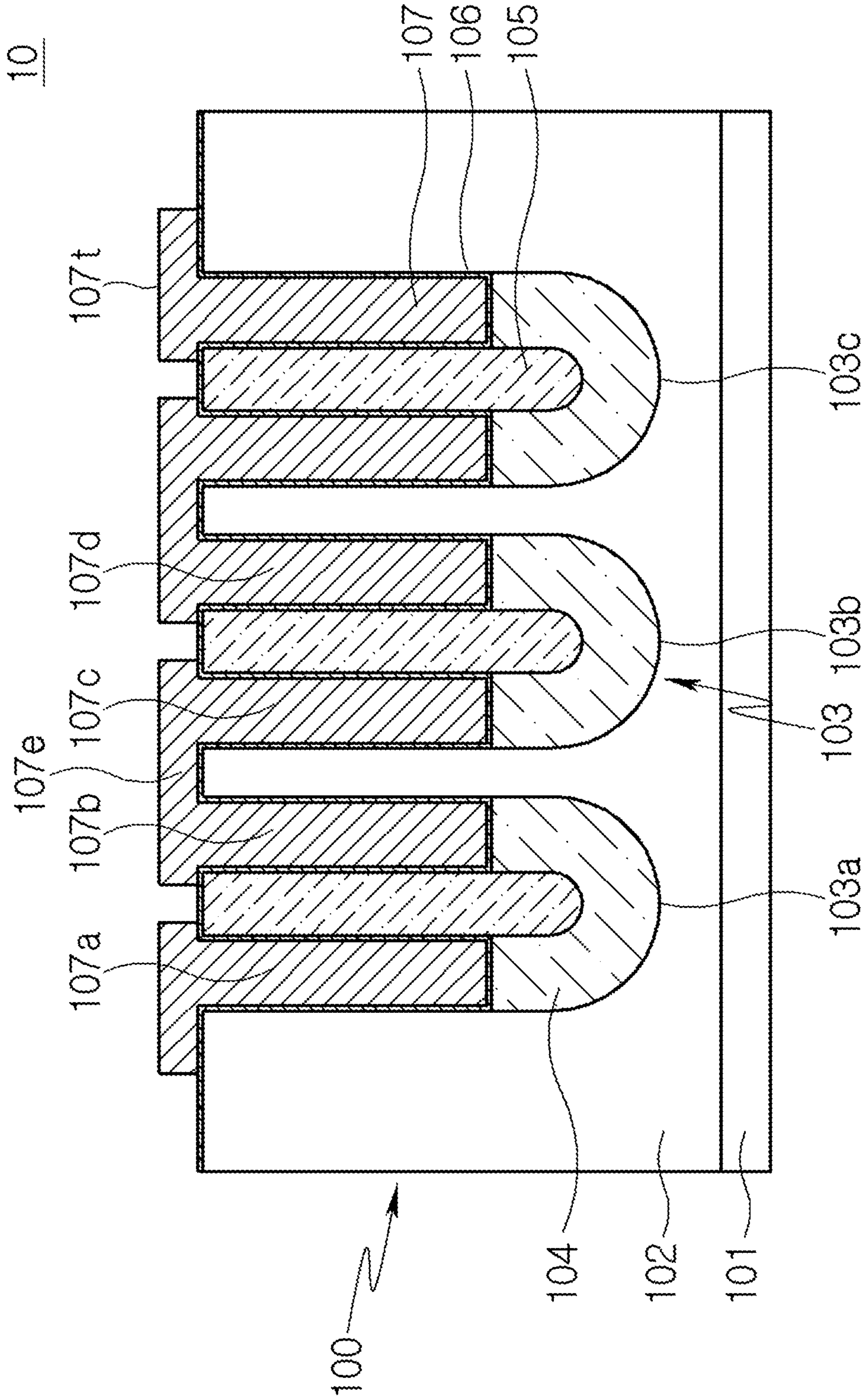
FIG. 4 illustrates a cross-sectional view of the A-A' line in FIG. 2.

FIG. 4 illustrates a cross-sectional view of the A-A' line shown in FIG. 2.

Referring to FIG. 4, the outer electrode 107 may be formed on the capacitor dielectric layer 106 formed in the trench 103. The outer electrode 107 may comprise two adjacent outer electrodes 107*a* and 107*b* in a cross-sectional view. The two adjacent outer electrodes 107*a* and 107*b* formed in the first trench 103*a* may surround the inner electrode 105 and be symmetrically arranged with respect to the inner electrode 105. The outer electrode 107 may have a depth shallower than a depth of the inner electrode 105 with respect to a top surface of the semiconductor substrate 100.

The one outer electrode 107*b* formed in the first trench 103*a* is positioned in parallel with another outer electrode 107*c* formed in a neighboring trench 103*b*. The one outer electrode 107*b* formed in the first trench 103*a* may be physically connected to the another outer electrode 107*c* formed in the neighboring trench 103*b* through a connection portion 107*e* of the outer electrode 107. The connection portion 107*e* of the outer electrode 107 may be disposed above the inner electrode 105. The two outer electrodes 107*b* and 107*c* and the connection portion 107*e* are made of the metal layer or metal nitride layer, and they are made of the same material, such as TiN, TaN, WN, Ti, Ta, W, Al, Cu, or a combination thereof.

A top surface 107*t* of the outer electrode 107 may protrude above a top surface of the semiconductor substrate 100. The top surface of the inner electrode 105 is almost coplanar with the top surface of the semiconductor substrate 100. Thus, the top surface 107*t* of the outer electrode 107 may have a height higher than a height of the top surface of the inner electrode 105. The outer electrode 107 may have a vertical length slightly smaller than a vertical length of the inner electrode 105.

The detailed explanations of the other elements are the same as in FIG. 1 and will therefore be omitted hereinafter.

Figure 5:
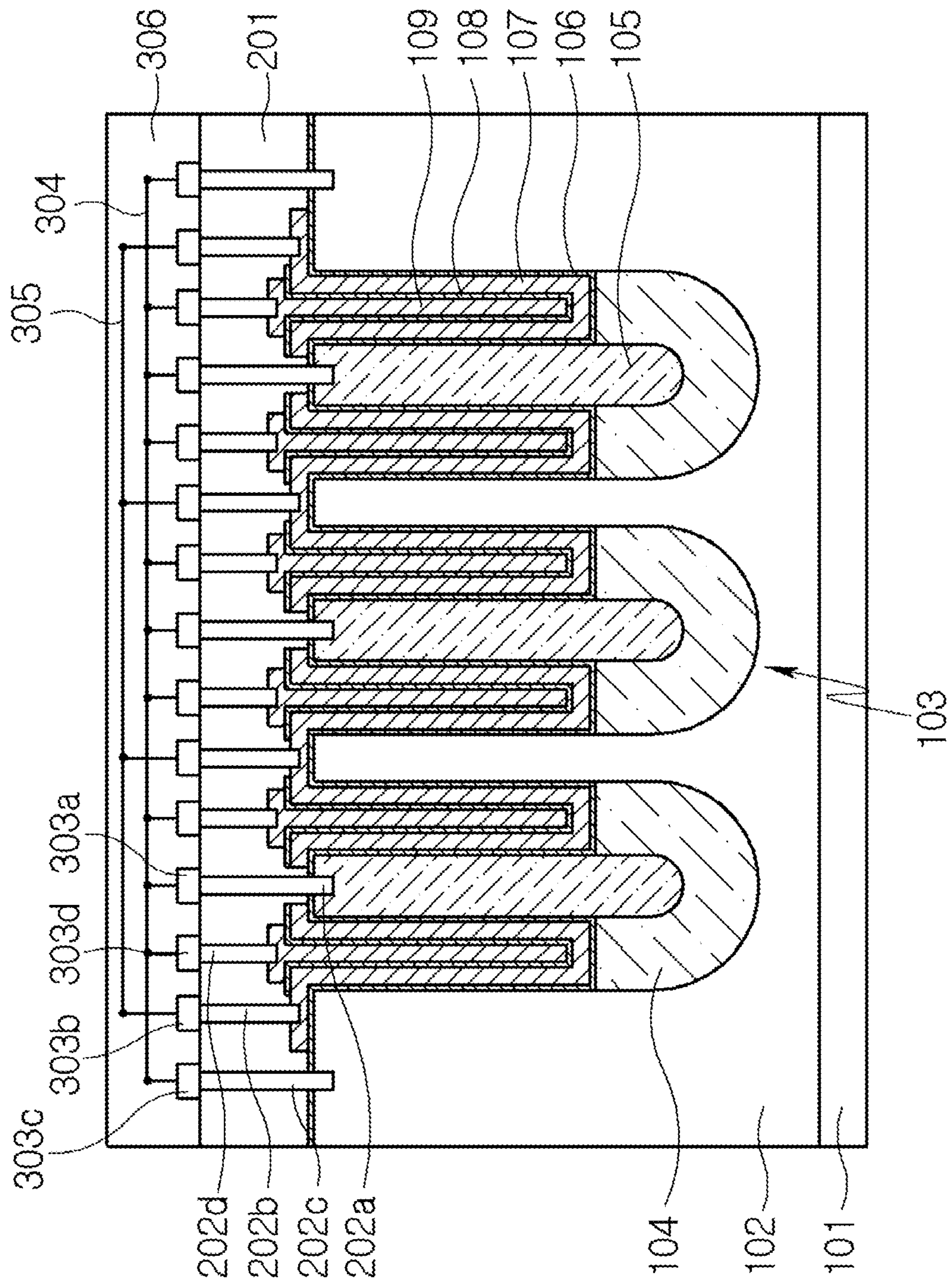
FIG. 5 illustrates a cross-sectional view of a semiconductor device having a low resistivity trench capacitor according to another example of the present disclosure.

FIG. 5 illustrates a cross-sectional view of a semiconductor device having a low resistivity trench capacitor according to another example. The same configurations as those of the trench capacitor described with reference to FIG. 1 will be omitted and added configurations will be described.

Referring to FIG. 5, the semiconductor device having a low resistivity trench capacitor structure 30 according to another example may further include a middle capacitor dielectric layer 108, a middle electrode 109, a fourth contact plug 202*d*, and a fourth metal wiring 303*d*, in addition to the configurations of the trench capacitor 10 described with reference to FIG. 1. Here, the middle capacitor dielectric layer 108 and the middle electrode 109 may provide an additional trench capacitor and increase the capacitance per unit area. Thus, the total capacitance of the trench capacitor shown 30 in FIG. 5 may be higher than that of the trench capacitor 10 shown in FIG. 1.

Referring to FIG. 5, the middle capacitor dielectric layer 108 may be formed on the outer electrode 107. The middle capacitor dielectric layer 108 may comprise silicon oxide, silicon nitride, silicon oxynitride, or high-k materials. Examples of the high-k materials may include, but are not limited to, Al2O3, HfO2, Ta2O5, and the like. The middle capacitor dielectric layer 108 may comprise the same material as the capacitor dielectric layer 106.

The middle electrode 109 may be formed on the middle capacitor dielectric layer 108. The middle electrode 109 may be surrounded by the middle capacitor dielectric layer 108. The middle electrode 109 may comprise titanium nitride (TIN), tungsten nitride (WN), tantalum nitride (TaN), titanium (Ti), tungsten (W), tantalum (Ta), aluminum (Al), copper (Cu), or a combination thereof. The middle electrode 109 may comprise the same material as the outer electrode 107 (second electrode 107). The metallic layer of the outer, inner and middle electrodes 105, 107 and 109 may provide a lower resistivity of the trench capacitor structure 10.

The fourth contact plug 202*d* may be connected to the middle electrode 109. As illustrated in FIG. 5, the fourth metal wiring 303*d* may be connected to the fourth contact plug 202*d*.

Referring to FIG. 5, the first metal interconnection 304, the second metal interconnection 305, and the second inter-layer insulating layer 306 may be formed on the first inter-layer insulating layer 201 and the first to fourth metal wirings 303*a* to 303*d*.

The first, third and fourth metal wirings 303*a*, 303*c* and 303*d* may be electrically connected to each other through the first metal interconnection 304 to form lower electrodes in the semiconductor device having a low resistivity trench capacitor structure 30.

In addition, the second metal wiring 303*b* and adjacent second metal wirings 303*b* may be electrically connected to each other through the second metal interconnection 305 to form upper electrodes in the semiconductor device having a low resistivity trench capacitor structure 30.

Figure 6:
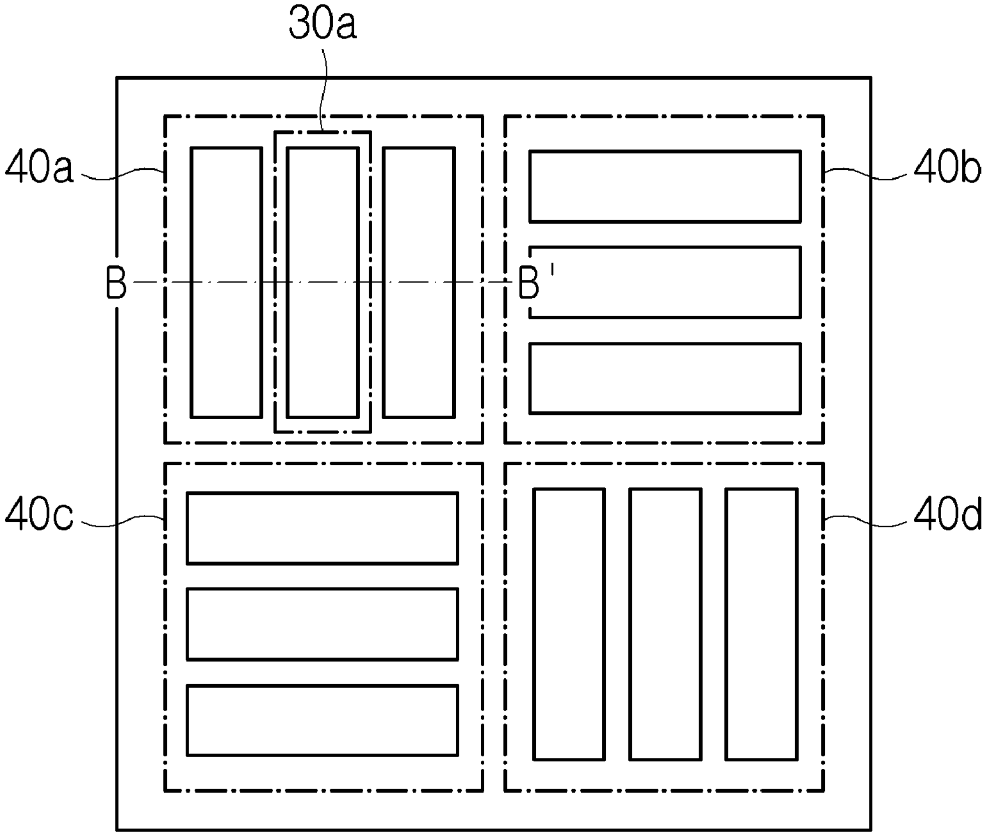
FIG. 6 illustrates an array of trench capacitors according to another example of the present disclosure.

FIG. 6 illustrates an array of trench capacitors according to another example of the present disclosure.

Referring to FIG. 6, the array of trench capacitors may comprise multiple groups, e.g., a first group 40*a*, a second group 40*b*, a third group 40*c*, and a fourth group 40*d*. For example, each group may include at least three trench capacitors 30*a*. The first and fourth groups 40*a* and 40*d* are arranged diagonally to each other, and they may have the same long axis direction. In the same manner, the second and third groups 40*b* and 40*c* are arranged diagonally to each other, and they may have the same long axis direction. The major axis (long axis) directions of the first and fourth groups 40*a* and 40*d* are perpendicular to those of the second and third groups 40*b* and 40*c*. The array trench capacitor having these orientations may be useful for increasing the pattern density and total capacitance of the semiconductor device having a low resistivity trench capacitor structure 30*a*.

Figure 7:
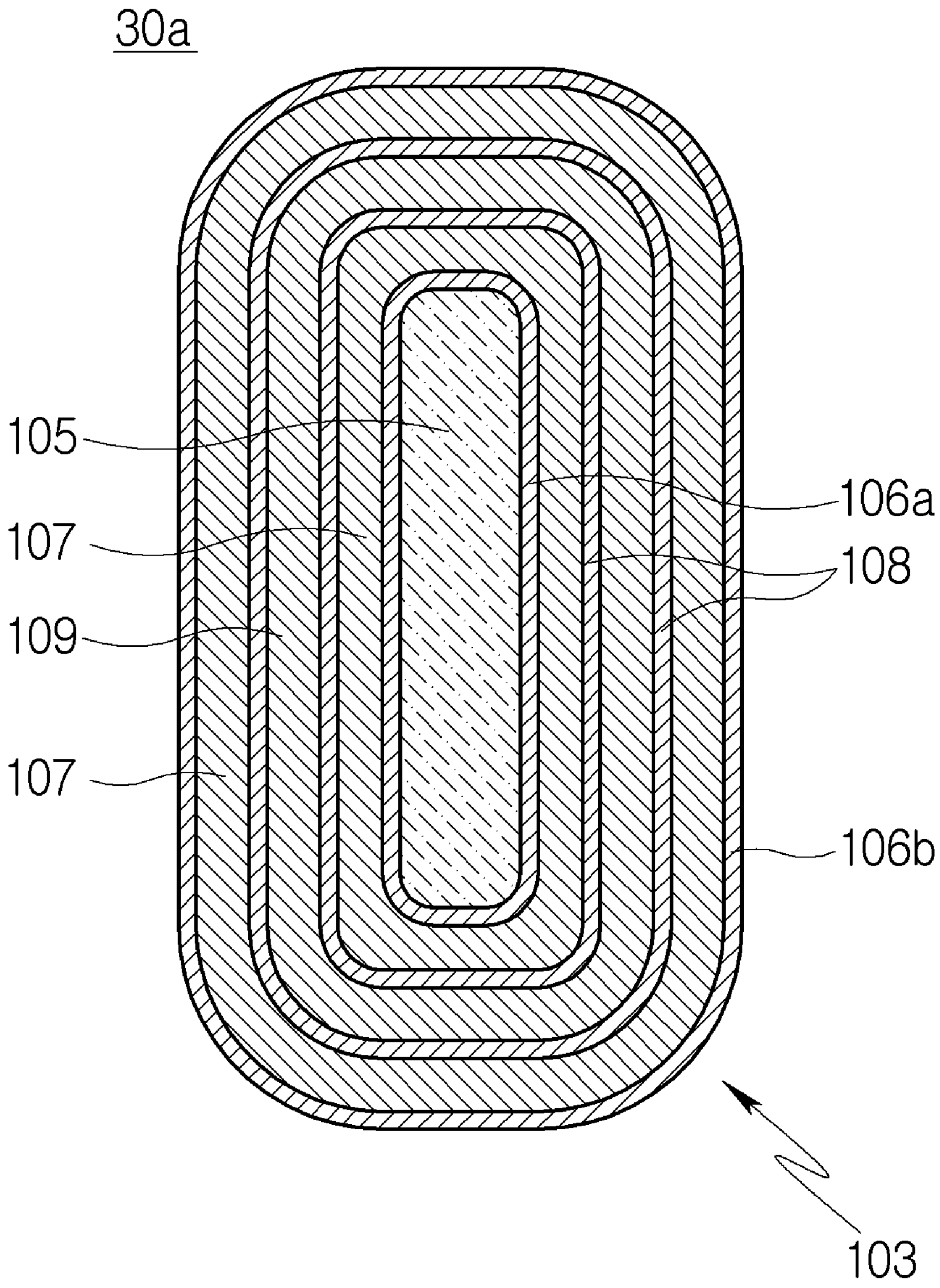
FIG. 7 illustrates a top view of one trench capacitor in FIG. 6.

FIG. 7 illustrates a top view of a trench capacitor shown in FIG. 6.

Referring to FIG. 7, the trench capacitor may comprise an inner electrode 105, an inner capacitor dielectric layer 106*a*, an outer capacitor dielectric layer 106*b*, an outer electrode 107, a middle capacitor dielectric layer 108, and a middle electrode 109.

The inner electrode 105 may be disposed in a central portion of the trench 103. The outer electrode 107 may surround the inner electrode 105. The outer electrode 107 may also surround the middle electrode 109 as well as the inner electrode 105. The middle electrode 109 may be surrounded by the outer electrode 107.

The inner capacitor dielectric layer 106*a* may be disposed between the inner electrode 105 and the outer electrode 107. The middle capacitor dielectric layer 108 may be disposed between the middle electrode 109 and the outer electrode 107. The outermost capacitor dielectric layer 106*b* may enclose the inner electrode 105, the outer electrode 107, the middle electrode 109, the inner capacitor dielectric layer 106*a*, and the middle capacitor dielectric layer 108.

Further, in a plan view, each top corner of the inner, outer, and middle electrodes 105, 107 and 109 may be rounded. A tensile or compressive stress may generally be concentrated at a corner of the deep trench. The rounded corner may be helpful in relieving the tensile or compressive stress at the corner.

Figure 8:
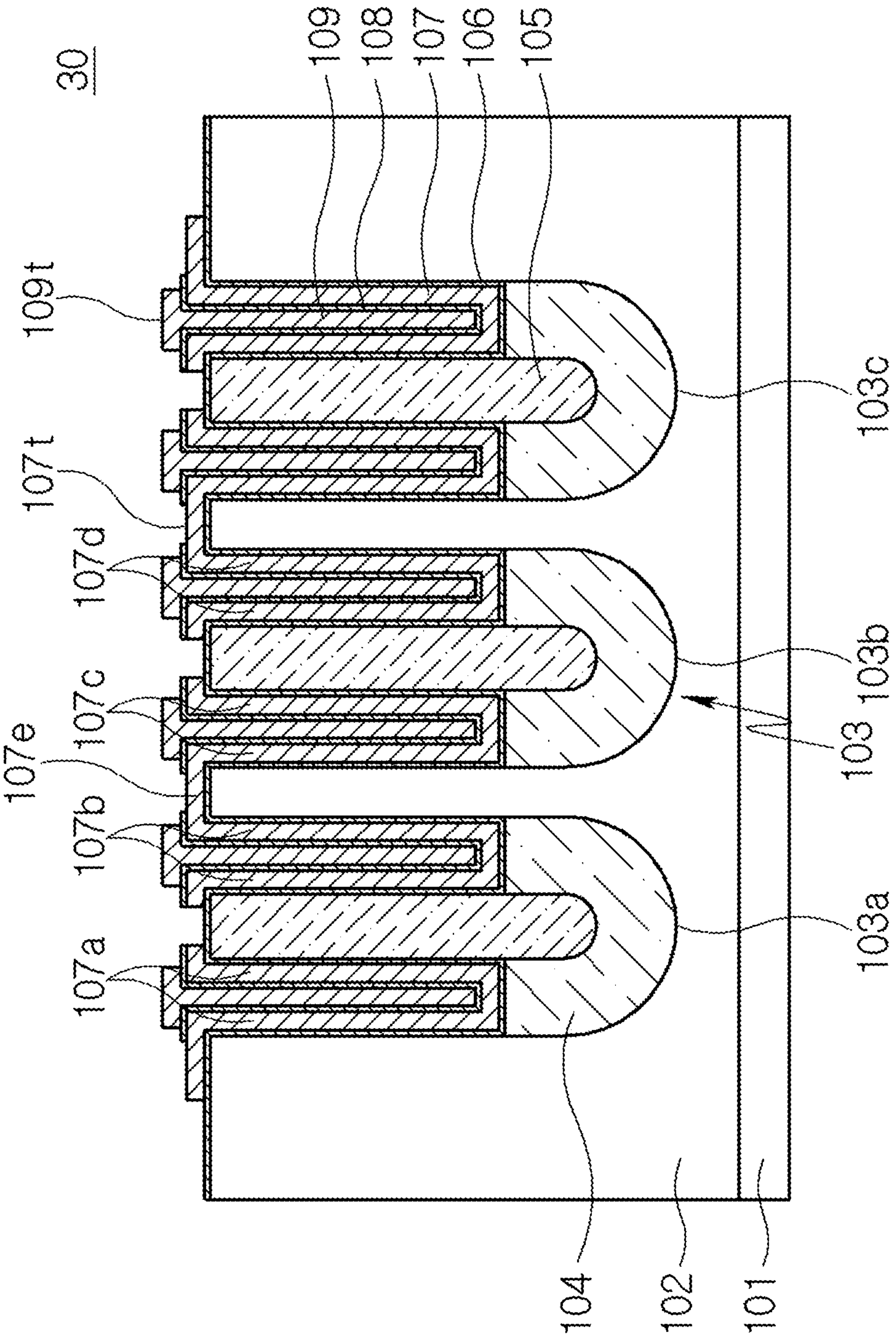
FIG. 8 illustrates a cross-sectional view of the B-B' line in FIG. 6.

FIG. 8 illustrates a cross-sectional view of the B-B' line shown in FIG. 6.

Referring to FIG. 8, the outer electrode 107 may be formed on the capacitor dielectric layer 106 formed in the trench 103. The outer electrode 107 may comprise two adjacent outer electrodes 107*a* and 107*b* in the first trench 103*a*. The two adjacent outer electrodes 107*a* and 107*b* formed in the first trench 103*a* may surround the inner electrode 105 and be symmetrically arranged with respect to the inner electrode 105. The outer electrode 107 may have a depth shallower than a depth of the inner electrode 105 with respect to a top surface of the semiconductor substrate 100.

One outer electrode 107*b* in the first trench 103*a* is positioned in parallel to another outer electrode 107*c* in a neighboring trench (a second trench) 103*b*. The one outer electrode 107*b* formed in the first trench 103*a* may be physically connected to another outer electrode 107*c* formed in a neighboring trench 103*b* through a connection portion 107*e* of the outer electrode 107. The connection portion 107*e* of the outer electrode 107 may be disposed above the inner electrode 105.

All of the third and fourth outer electrodes 107*c* and 107*d* and the connection portion 107*e* may be a metallic layer, so that the total resistivity of the trench capacitor structure 30 may be much lower than a resistivity of the conventional trench capacitor structure using a doped poly-Si electrode.

A top surface 107*t* of the outer electrode 107 may protrude above a top surface of the semiconductor substrate 100. Thus, the outer electrode 107 may have the top surface 107*t* having a height higher than a height of the top surface of the inner electrode 105. The outer electrode 107 may have a vertical length which is slightly smaller than a vertical length of the inner electrode 105.

A top surface 109*t* of the middle electrode 109 may also protrude above a top surface of the semiconductor substrate 100. Thus, the middle electrode 109 may have the top surface 109*t* having a height higher than a height of each top surface of the inner electrode 105 and the outer electrode 107.

Detailed descriptions of the other elements are the same as in FIG. 1 and are therefore omitted hereinafter. Detailed configurations shown in a cross-section of the trench capacitor of FIG. 8 are described with reference to FIG. 5 and are therefore omitted hereinafter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A trench capacitor, comprising:

a trench disposed in a substrate;

an inner electrode disposed in a central portion of the trench and extending in a vertical direction, the inner electrode having a top surface and a bottom surface;

an outer electrode disposed symmetrically with respect to the inner electrode, the outer electrode having a depth that is shallower than a depth of the inner electrode relative to a top surface of the substrate;

a thick bottom insulating layer disposed below the inner electrode and the outer electrode; and a capacitor dielectric layer surrounding the outer electrode, wherein the outer electrode protrudes above the top surface of the substrate and has a top surface that is higher than the top surface of the inner electrode.

2. The trench capacitor of claim 1, wherein the outer electrode disposed in the trench is physically connected to another outer electrode disposed in an adjacent trench.

3. The trench capacitor of claim 2, wherein a connection portion is disposed between the outer electrode and the another outer electrode and is positioned above the top surface of the substrate.

4. The trench capacitor of claim 1, wherein the outer electrode comprises a metallic layer.

5. The trench capacitor of claim 1, wherein the capacitor dielectric has a thickness thinner than a thickness of the thick bottom insulation layer, and wherein the outer electrode has a ring shape surrounding the inner electrode in a plan view.

6. The trench capacitor of claim 1, wherein the capacitor dielectric layer is disposed at least along trench sidewalls of an upper portion of the trench, interfaced with the thick bottom insulation layer, and extended on the top surface of the inner electrode.

7. The trench capacitor of claim 1, further comprising:

a doped region disposed in the substrate;

a first contact plug connected to the inner electrode;

a second contact plug connected to the outer electrode; and a third contact plug connected to the doped region and electrically connected to the first contact plug by a first metal interconnection.

8. A trench capacitor, comprising:

a first trench and a second trench disposed in a substrate;

a first inner electrode disposed in a central portion of the first trench;

a first capacitor dielectric layer disposed on the first inner electrode;

a second inner electrode disposed in a central portion of the second trench;

a second capacitor dielectric layer disposed on the second inner electrode;

a first outer electrode and a second outer electrode disposed in the first trench and arranged symmetrically with respect to the first inner electrode; and a third outer electrode and a fourth outer electrode disposed in the second trench and arranged symmetrically with respect to the second inner electrode, wherein each of the first to fourth outer electrodes has a depth that is shallower than a depth of each of the first and second inner electrodes relative to a top surface of the substrate, wherein the first and second outer electrodes protrude above the top surface of the substrate, and each has a top surface located higher than a top surface of the first inner electrode, and wherein the second outer electrode disposed in the first trench is physically connected to the third outer electrode disposed in the second trench.

9. The trench capacitor of claim 8, wherein the second and third outer electrodes are connected to each other through a connection portion disposed on the top surface of the substrate.

10. The trench capacitor of claim 8, wherein each of the first to fourth outer electrodes comprises a material different from a material of the first or second inner electrode.

11. The trench capacitor of claim 8, further comprising:

a thick bottom insulating layer formed below the first inner electrode and the first and second outer electrodes;

a doped region disposed in the substrate;

a first contact plug connected to the first inner electrode;

a second contact plug connected to the first and second outer electrodes; and a third contact plug connected to the doped region, wherein the third contact plug is electrically connected to the first contact plug through a first metal interconnection.

12. The trench capacitor of claim 11, further comprising:

a middle electrode disposed in a central portion of each of the first to fourth outer electrodes;

a middle capacitor dielectric layer disposed under the middle electrode; and a fourth contact plug connected to the middle electrode and electrically connected to the first contact plug through the first metal interconnection.

13. A trench capacitor, comprising:

a first trench and a second trench disposed in a substrate;

a first inner electrode disposed in a central portion of the first trench;

a first capacitor dielectric layer disposed on the first inner electrode;

a second inner electrode disposed in a central portion of the second trench;

a second capacitor dielectric layer disposed on the second inner electrode;

a first outer electrode and a second outer electrode disposed in the first trench and arranged symmetrically with respect to the first inner electrode; and a third outer electrode and a fourth outer electrode disposed in the second trench and arranged symmetrically with respect to the second inner electrode, wherein each of the first to fourth outer electrodes has a depth that is shallower than a depth of each of the first and second inner electrodes relative to a top surface of the substrate, wherein the second outer electrode disposed in the first trench is physically connected to the third outer electrode disposed in the second trench, and wherein the second and third outer electrodes are connected to each other through a connection portion disposed on and extending along the top surface of the substrate.

* * * * *